US008030215B1

(12) United States Patent
Sutardja et al.

(10) Patent No.: US 8,030,215 B1
(45) Date of Patent: Oct. 4, 2011

(54) METHOD FOR CREATING ULTRA-HIGH-DENSITY HOLES AND METALLIZATION

(75) Inventors: Pantas Sutardja, Los Gatos, CA (US); Runzi Chang, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 172 days.

(21) Appl. No.: 12/362,405

(22) Filed: Jan. 29, 2009

Related U.S. Application Data

(60) Provisional application No. 61/029,717, filed on Feb. 19, 2008.

(51) Int. Cl.
*H01L 21/00* (2006.01)
(52) U.S. Cl. .................. 438/700; 257/E21.023
(58) Field of Classification Search .......... 438/400, 438/689, 694–697, 700, 703, 760, 778; 257/E21.023, E21.54
See application file for complete search history.

(56) References Cited

U.S. PATENT DOCUMENTS

| | | | | |
|---|---|---|---|---|
| 5,710,061 A * | 1/1998 | Cleeves | ......................... | 438/618 |
| 7,564,084 B2 * | 7/2009 | Song et al. | .................... | 257/296 |
| 2003/0039893 A1 * | 2/2003 | Farnsworth et al. | .............. | 430/5 |
| 2006/0263699 A1 * | 11/2006 | Abatchev et al. | ................. | 430/5 |
| 2006/0263973 A1 * | 11/2006 | Thomas | ........................ | 438/238 |
| 2007/0048674 A1 * | 3/2007 | Wells | ............................ | 430/313 |
| 2007/0207620 A1 * | 9/2007 | Doebler | ....................... | 438/712 |
| 2007/0254472 A1 * | 11/2007 | Hayashi | ....................... | 438/631 |
| 2009/0142902 A1 * | 6/2009 | Subramanian | ............... | 438/424 |

* cited by examiner

*Primary Examiner* — Matthew Smith
*Assistant Examiner* — Michele Fan

(57) ABSTRACT

Methods and apparatuses directed to high density holes and metallization are described herein. A method may include providing a dielectric layer including a plurality of holes, forming a fill material over a top surface of the dielectric layer and in the plurality of holes, and reflowing the fill material to substantially remove any voids in the plurality of holes. Other embodiments are also described.

5 Claims, 9 Drawing Sheets

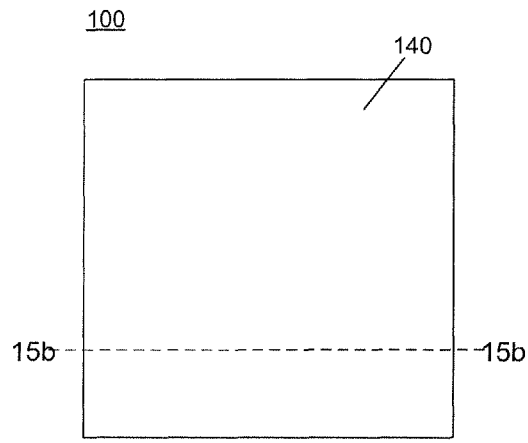
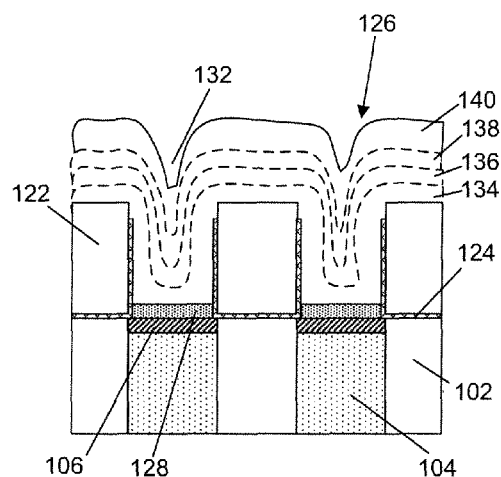
Figure 15a    Figure 15b
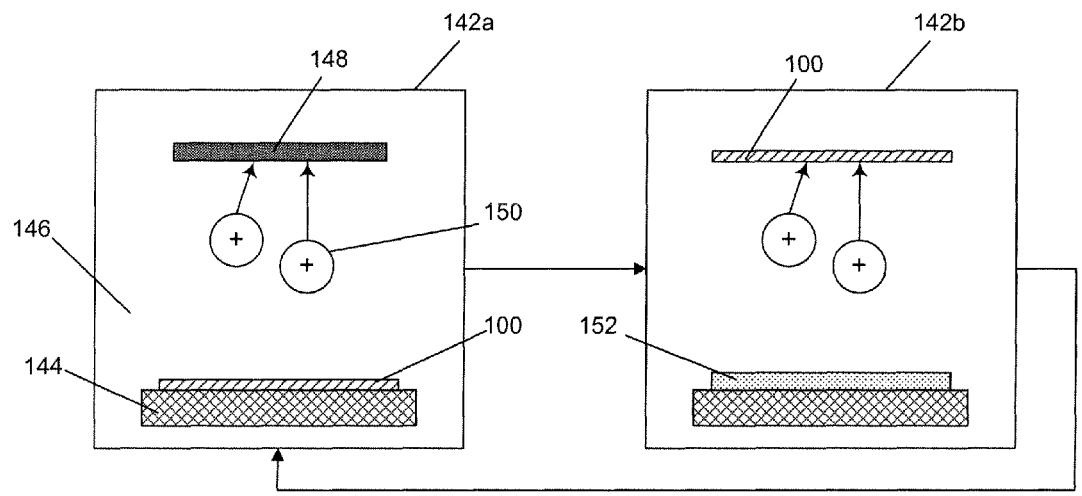
Figure 16

METHOD FOR CREATING ULTRA-HIGH-DENSITY HOLES AND METALLIZATION

CROSS-REFERENCE TO RELATED APPLICATIONS

The present application claims priority to U.S. Provisional Patent Application No. 61/029,717, filed Feb. 19, 2008, the entire disclosure of which is hereby incorporated by reference in its entirety for all purposes except for those sections, if any, that are inconsistent with this specification.

TECHNICAL FIELD

Embodiments of the present invention relate to the field of microelectronics, in particular, to methods for creating ultra-high-density holes and metallization.

BACKGROUND

Memory cells of electronic memory devices such as dynamic random access memory typically employ a number of electronic components in order to save data. For instance, in order to store data, a combination of electronic components such as transistors, diodes, and/or capacitors are typically employed in such memory cells to store or not store electrical charges. If a charge is stored in such a memory cell, that may indicate a logic "1," and if no charge is stored in such a memory cell that may indicate a logic "0."

An alternative approach for storing data is to use memory cells made of phase change material. A phase change material is a material that can be placed into at least two physical states, a crystalline state and an amorphous state, by increasing or decreasing temperature. By changing the physical state of the phase change material, certain characteristics of the material, such as electrical resistance, may also change. Such properties may be exploited in order to form memory cells made of phase change material.

Such memory cells, particularly in high densities, are generally intricate and expensive to manufacture. One method for forming high-density arrays includes a two-step patterning of round holes for forming the phase change memory elements, each pattern being within the resolution of the capability of the photolithographic process. Even if a desired degree of density is achieved, however, filling the holes void-free is difficult. This is increasingly true due at least in part to increasing aspect ratios resulting in poor step coverage.

SUMMARY

In view of the problems in the state of the art, embodiments of the invention are directed to methods for forming ultra-high-density holes and metallization. More specifically, with the foregoing and other items in view, there is provided, in accordance with various embodiments of the invention, a method comprising providing a dielectric layer including a plurality of holes, forming a fill material over a top surface of the dielectric layer and in the plurality of holes, and reflowing the fill material to substantially remove any voids in the plurality of holes.

In accordance with various embodiments, the fill material may be reflown by heating the fill material. The fill material may be heated to a temperature between about 600° C. and 650° C.

In accordance with various embodiments, the fill material may be an oxide or a phase change material.

In accordance with various embodiments, the fill material may be formed without completely filling the plurality of holes with the fill material. Reflowing the fill material may completely fill the plurality of holes with the fill material.

Another method is also provided, comprising providing a substrate including a dielectric layer and a plurality of holes in the dielectric layer, forming a first layer of a fill material in the plurality of holes and over a top surface of the dielectric layer, removing at least a portion of the first layer over the top surface of the dielectric layer, and forming a second layer of the fill material in the plurality of holes and over the top surface of the dielectric layer having the at least the portion of the first layer removed to fill the plurality of holes with the fill material substantially free of any voids.

In accordance with various embodiments, the first layer may be formed by sputtering.

In accordance with various embodiments, the at least a portion of the first layer may be removed by sputter etching. The sputter etching the at least a portion of the first layer from the top surface of the dielectric layer may be performed by orienting the substrate in a sputter chamber as a sputter target.

In accordance with various embodiments, the removing the at least a portion of the first layer includes removing a portion of the first layer from the plurality of holes. The at least a portion of the first layer may be removed by etching.

In accordance with various embodiments, the first layer may be formed without completely filling the plurality of holes with the fill material.

In accordance with various embodiments, the at least a portion of the first layer may be removed by a chemical-mechanical-planarization operation.

In accordance with various embodiments, the fill material is an oxide or a phase change material.

Yet another method is described, comprising providing a dielectric layer including a plurality of holes, and plating the plurality of holes with a fill material to fill the plurality of holes with the fill material substantially free of any voids.

In accordance with various embodiments, the plating may be performed by electro-chemical-plating.

In accordance with various embodiments, the method may further comprise forming a seed layer over the dielectric layer and in the plurality of holes.

In accordance with various embodiments, the plating of the plurality of holes may include forming a plurality of layers of the fill material, the plurality of layers being configured in a stack.

Yet another method is described, comprising forming a sacrificial layer on a substrate, forming a mask layer on the sacrificial layer, patterning the mask layer to form a plurality of mask lines and to reveal first portions of the sacrificial layer, patterning the first plurality of mask lines to form a plurality of mask islands and to reveal second portions of the sacrificial layer, removing the revealed first and second portions of the sacrificial layer to form a plurality of pillars of the sacrificial layer disposed under corresponding ones of the plurality of mask islands, forming a dielectric layer on the sacrificial layer around the plurality of pillars, and removing the plurality of mask islands and the plurality of pillars to form a corresponding plurality of holes in the dielectric layer.

In accordance with various embodiments, a liner layer may be formed over the plurality of pillars and surface of the substrate after the removing the revealed first and second portions. The dielectric layer may be formed on the liner layer around the plurality of pillars.

In accordance with various embodiments, the removing the plurality of mask islands and the plurality of pillars may include removing the liner layer from top surfaces of the plurality of pillars.

In accordance with various embodiments, the patterning the mask layer may comprise exposing the mask layer with a first photomask including a plurality of lines, and wherein the patterning the first plurality of mask lines comprises exposing the first plurality of mask lines with a second photomask including a second plurality of lines.

In accordance with various embodiments, the second photomask may comprise the first photomask rotated 90°.

In accordance with various embodiments, the holes may be filled with an oxide or a phase change material. The phase change material may be germanium-antimony-tellurium.

In accordance with various embodiments, each of the plurality of holes may have a square shape.

The present invention also provides an apparatus including a substrate including an array of access devices, a dielectric layer formed on the substrate, and a plurality of phase change memory elements formed in the dielectric layer and electrically interconnected with corresponding ones of the access devices, each of the plurality of phase change memory elements having a substantially square shape.

In accordance with various embodiments, the access devices comprise access diodes or access transistors.

In accordance with various embodiments, the apparatus may further comprise a seed layer between the phase change memory elements and the dielectric layer and between the dielectric layer and the substrate.

In accordance with various embodiments, each of the access devices may include a bottom electrode contact formed thereon.

In accordance with various embodiments, the plurality of phase change memory elements comprise germanium-antimony-tellurium.

Other features that are considered as characteristic for embodiments of the invention are set forth in the appended claims.

BRIEF DESCRIPTION OF THE DRAWINGS

Embodiments of the present invention will be readily understood by the following detailed description in conjunction with the accompanying drawings. To facilitate this description, like reference numerals designate like structural elements. Embodiments of the invention are illustrated by way of example and not by way of limitation in the figures of the accompanying drawings.

FIGS. 1-15 are (a) top and (b) cross sectional schematic views of a substrate after various operations, in accordance with various embodiments of the present invention.

FIG. 16 schematically illustrates sputtering arrangements, in accordance with various embodiments of the present invention.

DETAILED DESCRIPTION OF EMBODIMENTS OF THE INVENTION

In the following detailed description, reference is made to the accompanying drawings which form a part hereof wherein like numerals designate like parts throughout, and in which is shown by way of illustration embodiments in which the invention may be practiced. It is to be understood that other embodiments may be utilized and structural or logical changes may be made without departing from the scope of the present invention. Therefore, the following detailed description is not to be taken in a limiting sense, and the scope of embodiments in accordance with the present invention is defined by the appended claims and their equivalents.

Various operations may be described as multiple discrete operations in turn, in a manner that may be helpful in understanding embodiments of the present invention; however, the order of description should not be construed to imply that these operations are order dependent. Moreover, some embodiments may include more or fewer operations than may be described.

The description may use the phrases "in an embodiment," "in embodiments," or "in various embodiments," which may each refer to one or more of the same or different embodiments. Furthermore, the terms "comprising," "including," "having," and the like, as used with respect to embodiments of the present invention, are synonymous.

For purposes of this description, the phrase "A/B" means A or B. The phrase "A and/or B" means "(A), (B), or (A and B)." The phrase "at least one of A, B, and C" means "(A), (B), (C), (A and B), (A and C), (B and C), or (A, B, and C)." The phrase "(A)B" means "(B) or (AB)," that is, A is an optional element.

The terms chip, die, integrated circuit, monolithic device, semiconductor device, and microelectronic device are often used interchangeably in the microelectronics field. The present invention is applicable to all of the above as they are generally understood in the field.

Embodiments of the present invention provide an ultra-high-density phase change memory apparatus and methods for making the same.

Figure 7A:
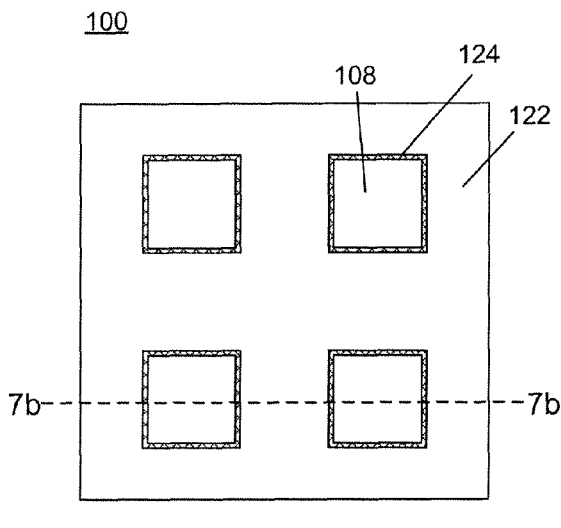
Figure 7B:
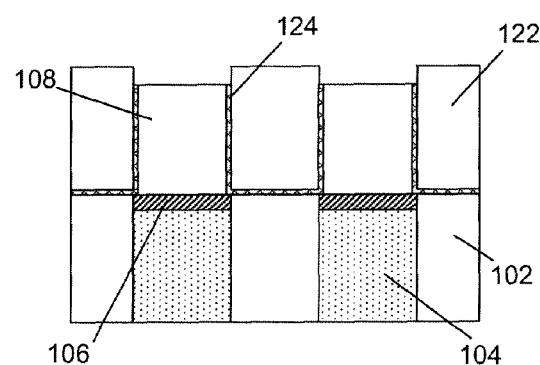
Figure 8A:
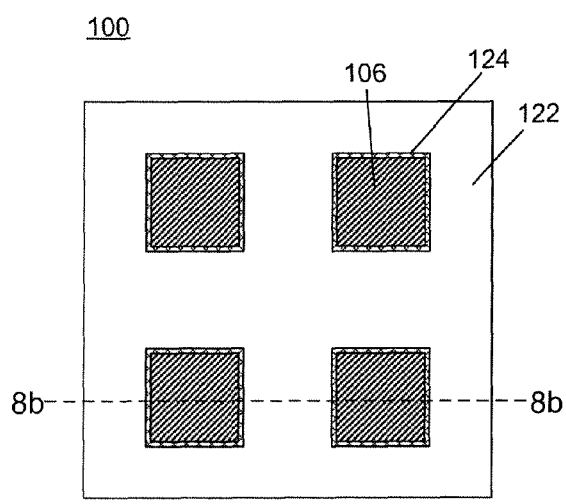
Figure 8B:
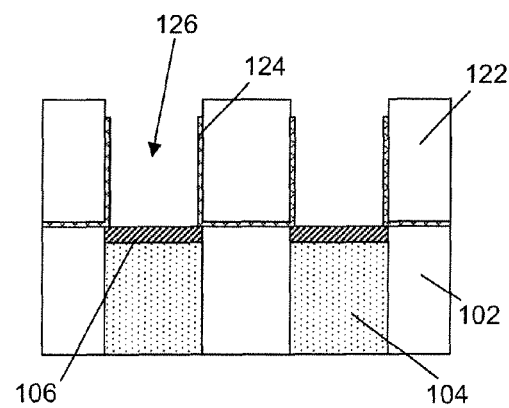

Referring now to FIGS. 1-8 (top views a, cross-sectional views b), in accordance with various embodiments, a device may comprise a substrate 100 including ultra-high-density holes 126 (see FIGS. 8*a*, 8*b*). The substrate 100 may generally comprise any substrate on which ultra-high-density holes (for metallization, for example) are desired. In the illustrated embodiments, the substrate 100 includes a portion of a phase change memory array including four access devices 104 for programming and reading. In reality, however, a phase change memory array may include thousands of phase change memory cells. Access devices 104 may include any resistive elements such as, for example, transistors or diodes. In yet other embodiments, the substrate 100 may be a device layer including one or more transistors or other devices, for example, and holes may be formed for the purpose of forming a metallization layer for electrically contacting the devices.

The substrate 100 may include access devices 104 surrounded by a dielectric material 102 for electrically insulating the access devices 104 from each other. The dielectric material 102 may be shallow trench isolation structures. The top surfaces of the access devices 104 may have a silicide layer 106 formed thereon for providing ohmic contacts. The silicidation may include depositing a layer of, for example, nickel or cobalt. In some embodiments, formation of the silicide layer 106 may be skipped.

Figure 1A:
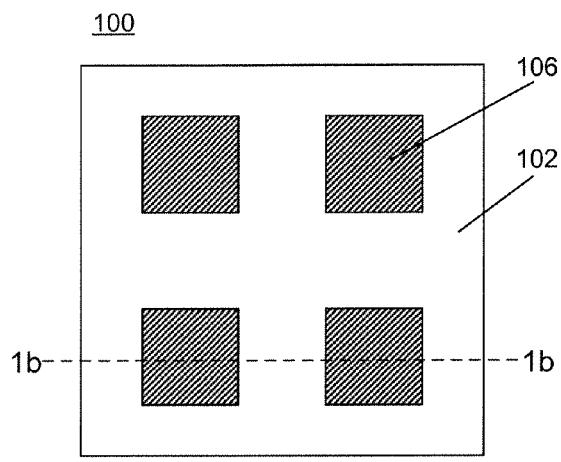
Figure 1B:
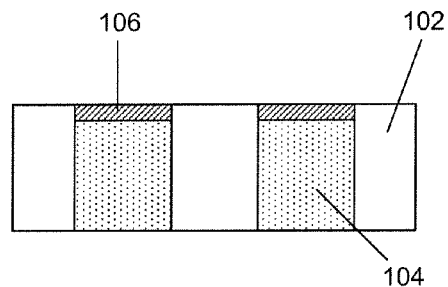
Figure 2A:
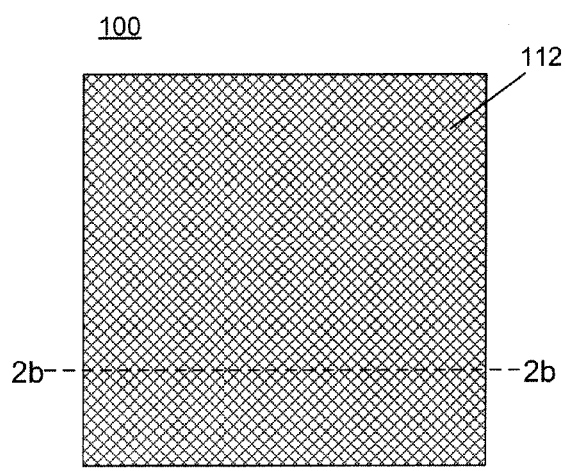
Figure 2B:
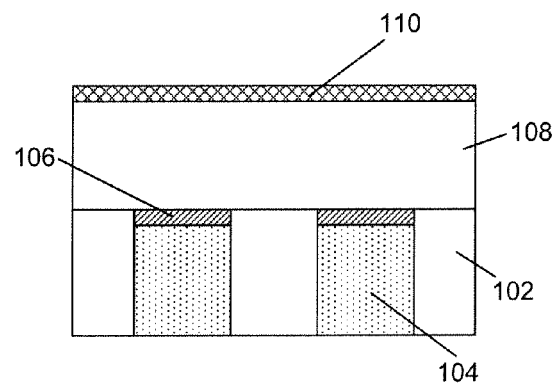

A sacrificial layer 108 may be formed over the substrate 100 as illustrated in FIGS. 2*a* and 2*b*. The sacrificial layer 108 may generally comprise any material suitable for later forming pillars 120 (see FIGS. 5*a*, 5*b*) at locations at which the holes 126 are to be formed (see FIGS. 8*a*, 8*b*). Typically, the sacrificial layer 108 comprises polysilicon, though in other embodiments, the sacrificial layer 108 may comprise a nitride (e.g., silicon nitride), an oxide (e.g., deposited silicon oxide), or some other suitable material.

A mask layer 110 may be formed over the sacrificial layer 108. The mask layer 110 may be used for patterning to form the pillars 120, and accordingly, the mask layer 110 may comprise any material suitable for photolithographic patterning and etching operations. Accordingly, the material used for the mask layer 110 would generally be one that has the appropriate etch selectively relative to the material used for the sacrificial layer 108. In some embodiments, photoresist may be suitable. Similarly, a hard mask may be suitable, and may, at least in some cases, be more durable than photoresist for the subsequent etch operations. Suitable hard mask materials may include silicon nitride. Other known hard mask materials may be similarly suitable.

Figures 3A, 3B:
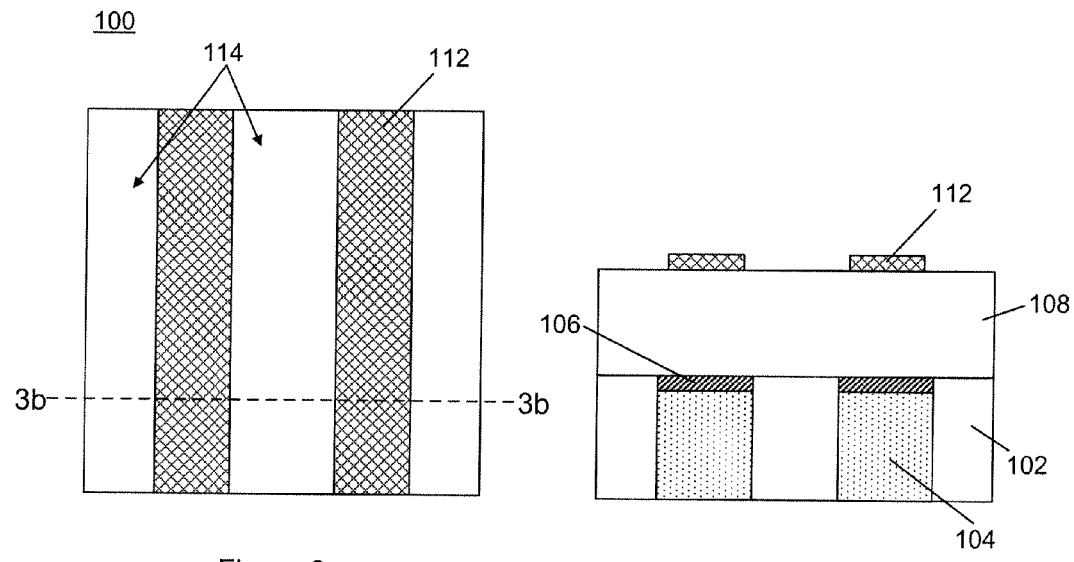

The mask layer 110 may be patterned to form a plurality of mask lines 112 and to reveal first portions 114 of the sacrificial layer 108, as illustrated in FIGS. 3a, 3b. A photolithographic operation may be used for exposing the desired line pattern onto the surface of the mask layer 110. A first photomask (not illustrated) including the desired line pattern may be used for the exposure operation. Patterning the mask layer 110 may further include developing the line pattern. The exposed regions of the mask layer 110 (or un-exposed regions if a negative photolithographic operation is used) are removed to reveal the sacrificial layer 108.

Figures 4A, 4B:
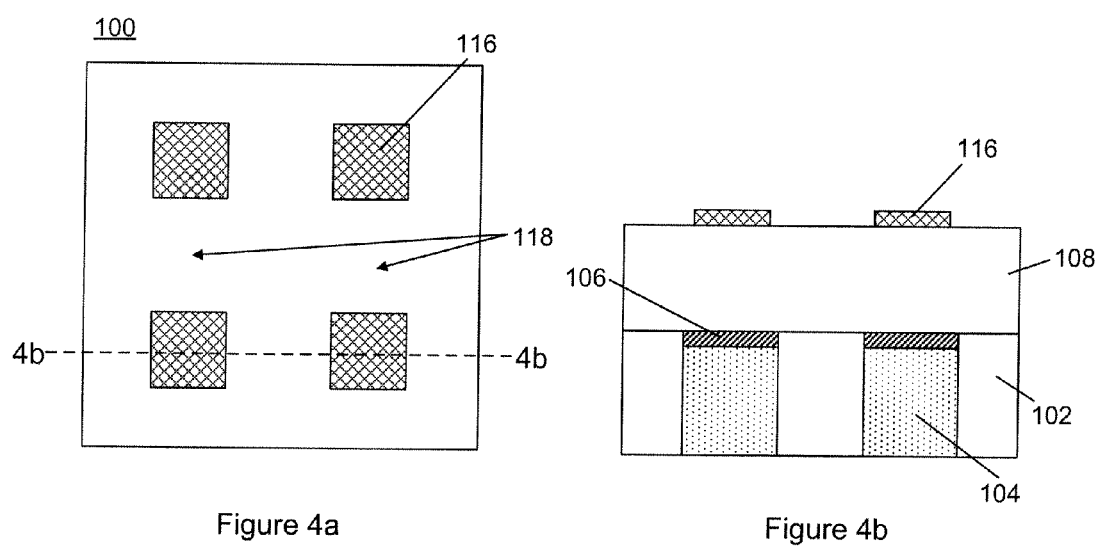

The plurality of mask lines 112, then, may be patterned to form a plurality of mask islands 116 and to reveal second portions 118 of the sacrificial layer 108, as illustrated in FIGS. 4a, 4b. A photolithographic operation similar to that used for forming the mask lines 112 may be used for forming the mask islands 116. A second photomask including a line pattern similar to that of the first photomask may be used for forming the mask islands 116 except that the photomask would be oriented such that the lines of the second patterning operation (for forming the mask islands 116) are perpendicular to the lines of the first patterning operation (for forming the mask lines 112). In some embodiments, the second photomask may be the first photomask rotated 90°.

Figure 5A:
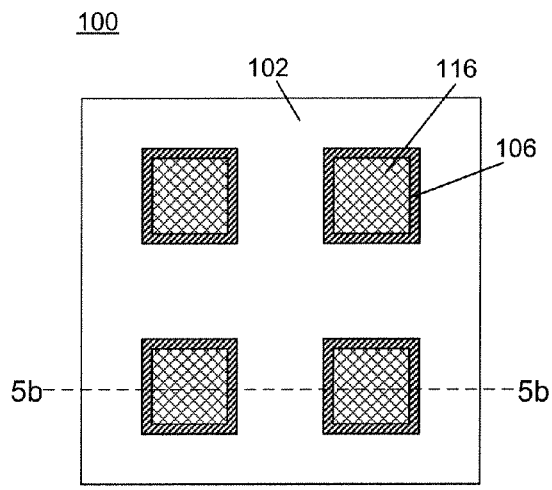
Figure 5B:
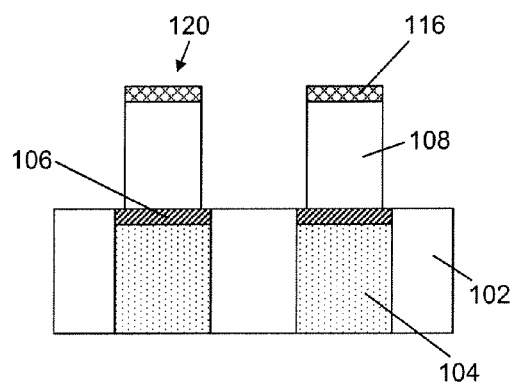

The revealed first portions 114 and second portions 118 of the sacrificial layer 108 may then be removed to form a plurality of pillars 120 disposed under corresponding ones of the plurality of mask islands 116, as illustrated in FIGS. 5a, 5b. The revealed first portions 114 and second portions 118 of the sacrificial layer 108 may be removed using any etch operation suitable for the purpose. In some embodiments, for example, the revealed first portions 114 and second portions 118 of the sacrificial layer 108 may be removed using an anisotropic etch (e.g., a dry etch).

Figure 6A:
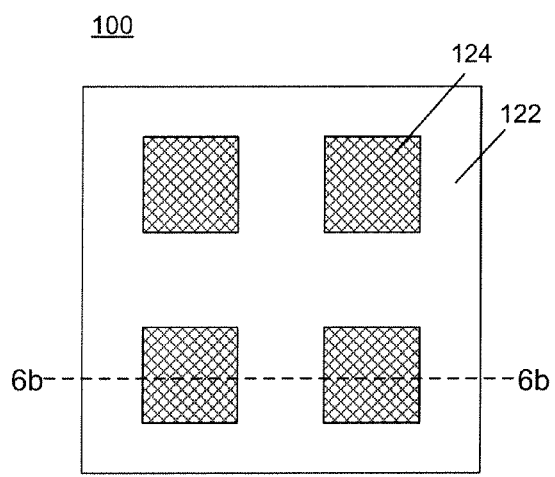
Figure 6B:
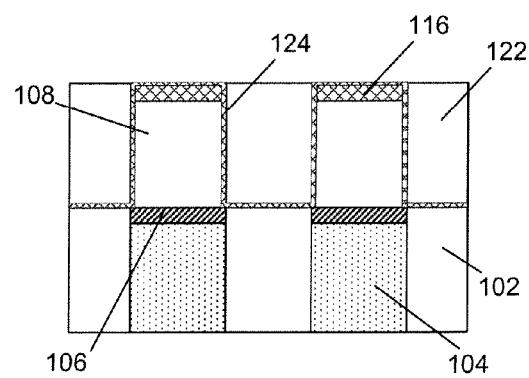

A dielectric layer 122 may be formed over the sacrificial layer 108, gap filling the areas around the plurality of pillars 120, as illustrated in FIGS. 6a, 6b. The dielectric layer 122 may comprise any suitable material for forming an interlayer dielectric layer. In some embodiments, the dielectric layer 122 may be a high density plasma oxide deposited by chemical vapor deposition.

Prior to formation of the dielectric layer 122, a liner layer 124 may be conformally formed over the surfaces of the dielectric layer 102 and the pillars 120. The liner layer 124 may be silicon oxynitride or silicon nitride. In some embodiments, additional liner layers (not illustrated) may be formed over the liner layer 124 and the additional layer(s) may be the same material as the liner layer 124, or may be a different material. For example, the additional layer(s) may be silicon oxide or a layer of another suitable material.

As illustrated, the top surfaces of the pillars 120 are not covered with the dielectric layer 122. When forming the dielectric layer 122, however, the pillars 120 may indeed be covered with dielectric material. For removing excess dielectric material, and to expose the liner layer 124 if present, a planarization operation may be performed. In some embodiments, the planarization operation may remove all material down to the mask islands 116, or even further down to the sacrificial layer 108. The planarization operation may be any suitable operation for planarizing the top surface of the device. For example, a chemical-mechanical-planarization may be suitable.

If the mask islands 116 and the liner layer 124 over the mask islands 116 are not removed during the planarization operation, then a separate etch operation may be performed for their removal, as illustrated in FIGS. 7a, 7b. The etch operation may be a wet etch or a dry etch. A suitable wet etch may include the conventional hot phosphoric acid etch.

Then, the exposed sacrificial layer 108 may be removed, stopping on the access device 104, or the silicide layer 106 if present, to form corresponding plurality of holes 126 in the dielectric layer 122. The resulting structure is illustrated in FIGS. 8a, 8b.

Figures 9A, 9B:
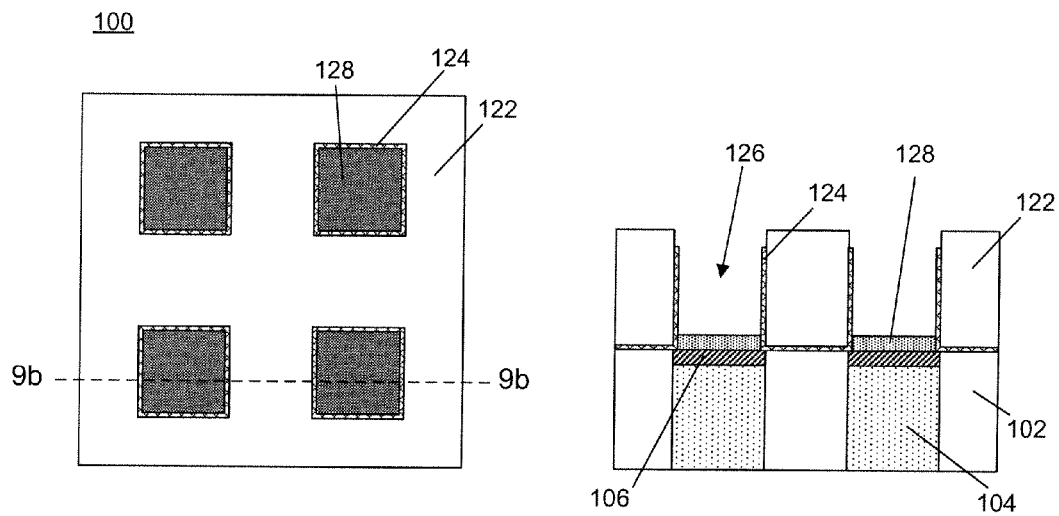

Turning now to FIGS. 9a and 9b, a bottom electrode contact (BEC) 128 may be formed at the bottom surfaces of the holes 126. The BEC 128 may comprise tungsten, titanium nitride, titanium tungsten, or another suitable conductor, or combinations thereof, for forming the BEC portion of a phase change memory cell.

Figures 10A, 10B:
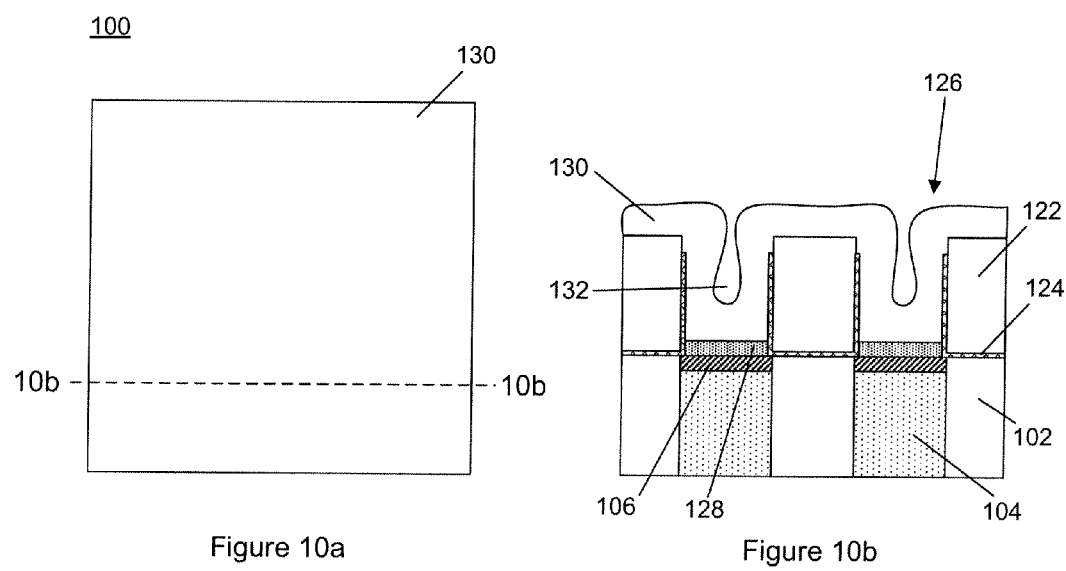

Next, a fill material 130 comprising phase change material is formed over a top surface of the dielectric layer 122 and in the plurality of holes 126, resulting in the structure illustrated in FIGS. 10a and 10b. The phase change material used for the fill material 130 may include any suitable phase change material including, for example, germanium-antimony-tellurium (GeSbTe). The phase change material may be formed by a suitable deposition operation including, for example, by physical vapor deposition (PVD). In some embodiments, phase change material may be formed by sputter deposition.

It is again noted that embodiments of the present invention are not limited to phase change memory applications. Although the illustrated embodiments generally depict the formation of phase change memory cells, ultra-high-density holes formed by various embodiments of methods described herein may be advantageously incorporated into various other types of devices. In these cases, a fill material other than phase change material may be formed in the holes. For example, the fill material may comprise a dielectric material or a conductor, depending on the particular application.

Referring again to FIGS. 10a, 10b, as can be seen the fill material 130 incompletely fills the holes 126, leaving voids 132. Poor step coverage may be due at least in part to the high aspect ratio of the holes 126. In some embodiments, for example, the holes 126 may have a height that is three or more times greater than its width. In any event, the voids 132 are generally undesirable at least because of the potential impact on reliability of the device.

Figure 11A:
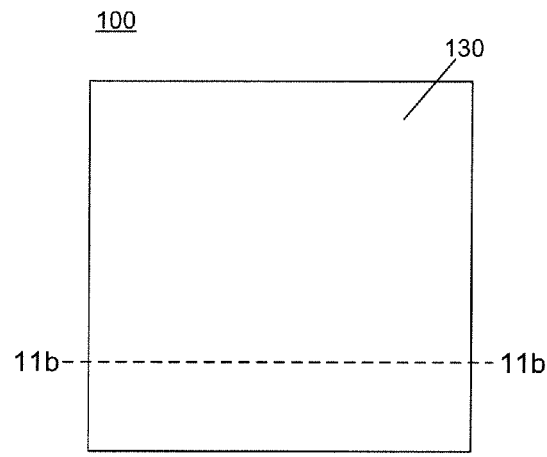
Figure 11B:
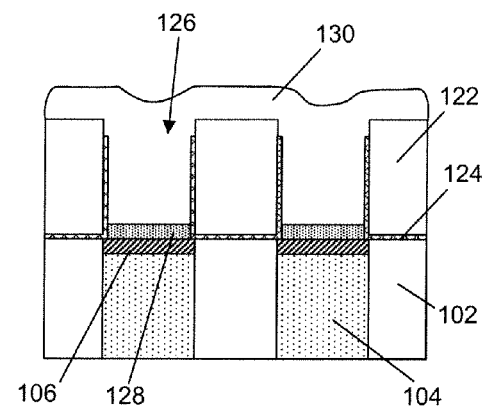

To substantially remove the voids 132, the fill material 130 may be reflown, as illustrated in FIGS. 11a and 11b. The fill material 130 may be reflown according to any suitable operation including, for example, heating the fill material 130 to a temperature sufficient to melt the fill material 130. For GeSbTe, the temperature may be between about 600° C. and 650° C. In some embodiments, it may be desirable for the reflow temperature to be high enough to melt the GeSbTe, yet low enough that diffusion of any dopants in the device is avoided (such diffusion may sometimes occur at temperatures exceeding 950° C.).

Figure 12A:
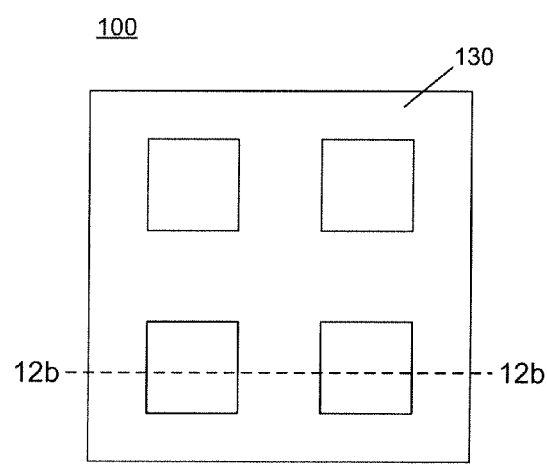
Figure 12B:
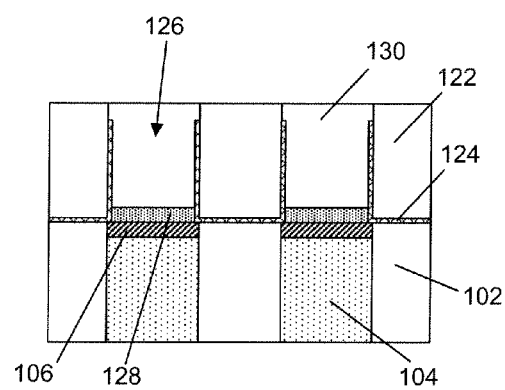

Following removal of the voids 132, a planarization operation may be performed for planarizing the surface of the device, as illustrated in FIGS. 12a and 12b. The planarization operation may be any suitable operation for planarizing the top surface of the device. For example, a chemical-mechanical-planarization may be suitable.

Another method for substantially removing voids 132 in the fill material 130 may include iterations of forming the fill material 130 and removing a portion of the fill material 130, as illustrated in FIGS. 13-15 (top views a, cross-sectional views b). Embodiments of this method may include first forming a layer of the fill material 130 in the holes 126 and over a top surface of the dielectric layer 122, as illustrated in FIGS. 10a and 10b.

Figures 13A, 13B:
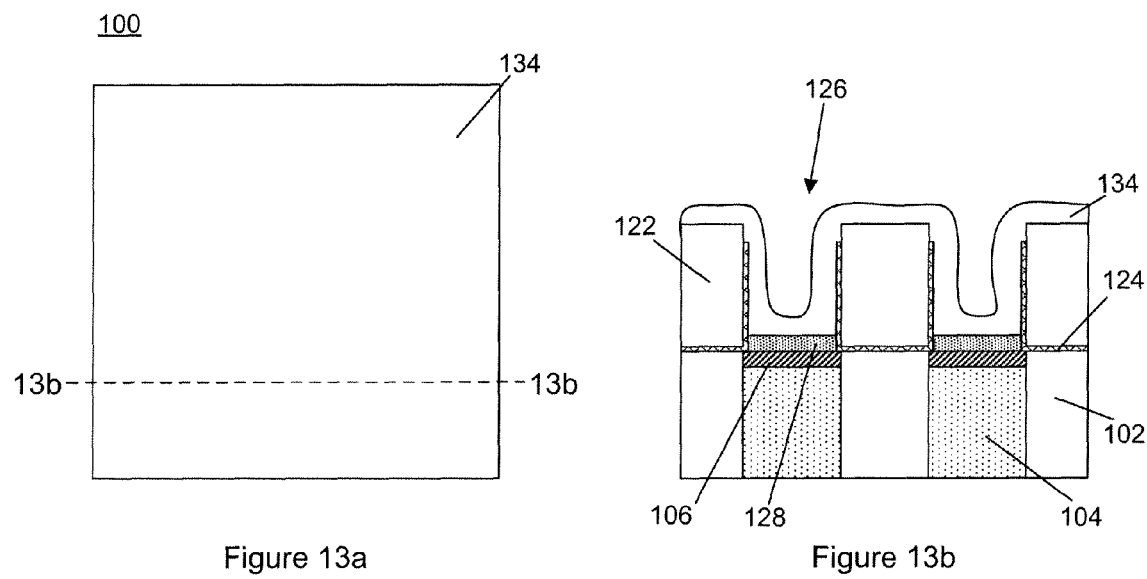

At least a portion of the layer of the fill material 130 (first layer 134) at least over the top surface of the dielectric layer 122 may then be removed, as illustrated in FIGS. 13a and 13b. The portion of the first layer 134 may be removed by etching or by chemical-mechanical-planarization. As the fill material outside of the holes 126 is exposed to more of the removal action (i.e., the etchant or polishing pad/slurry), less material is removed from deep inside of the holes 126, while more is removed outside of the holes and from the area of the holes 126 near the tops thereof.

Figures 14A, 14B:
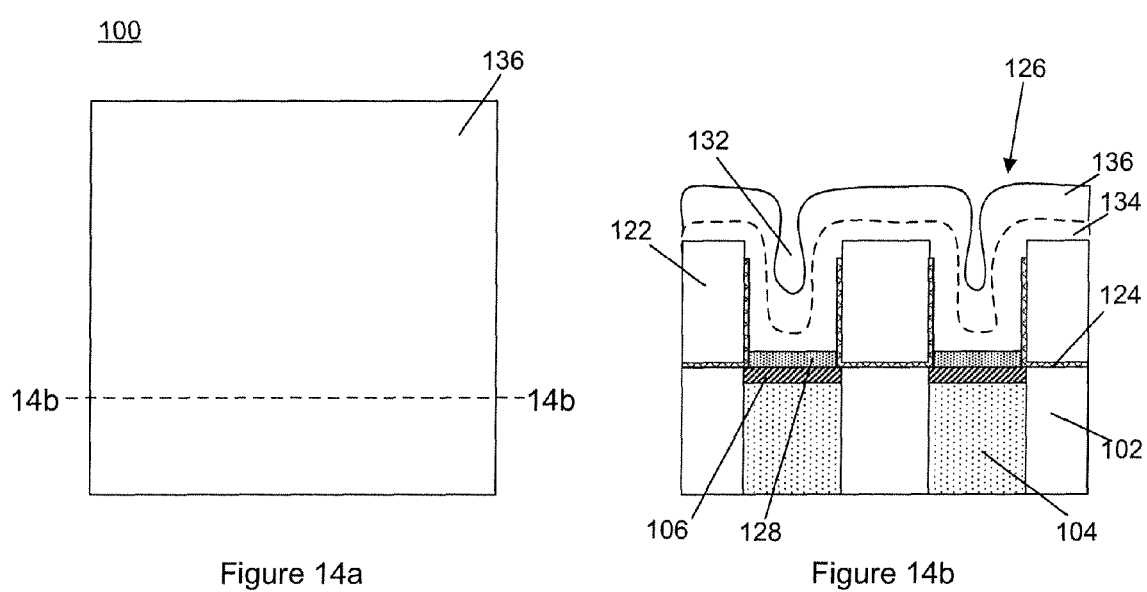

After removing the portion of the first layer 134 of the fill material, a second layer 136 of the fill material may be formed over the first layer 134, as illustrated in FIGS. 14a and 14b. As can be seen, the level of the fill material in the holes 126 has increased, with the voids 132 being effectively moved upwards towards the top of the holes 126.

Capitalizing on the increased removal of fill material 130 from the top surface of the dielectric layer 122, repeated iterations of forming of the fill material 130 and removing of portions of the formed fill material 130 may result in filling the holes 126 substantially void-free. In the exemplary embodiment illustrated in FIGS. 15a and 15b, four iterations have been performed, resulting in four layers 134, 136, 138, 140 of fill material. As can be seen, the voids 132 are fully outside of the holes 126.

As the voids 132 are no longer inside the holes 126, the holes 126 are now completely filled with fill material (i.e., the holes are no longer holes per se), substantially void-free. Accordingly, a planarization operation may be performed for planarizing the surface of the device, which may result in the device illustrated in FIGS. 12a and 12b. The planarization operation may be any suitable operation for planarizing the top surface of the device. For example, a chemical-mechanical planarization may be suitable.

In some embodiments, the iterations of forming of the fill material and removing of the portion of fill material may be performed by sputter deposition of the fill material and sputter etching of the fill material, respectively. These embodiments take advantage of the loading effect of the sputtering process, in which surface material is sputter etched quicker than at the bottom and sidewalls of the holes 126.

As illustrated in FIG. 16, an exemplary method of sputter deposition/sputter etching is illustrated by way of sputter furnace arrangements. The first furnace 142a and the second furnace 142b may be different furnaces or may be the same furnace. Each furnace 142a, 142b includes conventional features such as, for example, a stage 144 and a chamber 146.

The substrate 100 may include a plurality of holes 126, formed by a method described herein, such as that illustrated in FIGS. 8a and 8b. The substrate 100 may be first mounted onto the stage 144 in the chamber 146 of the furnace 142a. As in conventional, a target 148 comprised of material suitable for forming the desired layer of fill material (e.g., GeSbTe) is bombarded with energetic ions 150, causing atoms of the target 148 to be dislodged and ejected, forming a vapor. The vapor is then deposited onto the surface of the substrate 100. The deposited layer of fill material, however, may include voids, such as voids 132 in the structure illustrated in FIG. 10b.

At least a portion of the deposited fill material 130 may then be removed by sputter etching the portion from the top surface of the substrate 100, resulting in the structure illustrated in FIGS. 13a and 13b. To that end, the sputter etching of the layer 134 may be performed by orienting the substrate 100 in the chamber 146 as the sputter target. A portion of the deposited layer 134 of fill material may then be bombarded with energetic ions 150, causing atoms of the layer 134 of fill material to be dislodged and ejected, forming a vapor. The vapor may then be deposited onto the surface of a dummy wafer 152. As illustrated in FIGS. 13a, 13b, as the fill material outside of the holes 126 are exposed to more of the removal action (i.e., the ion bombardment), less fill material is removed from deep inside of the holes 126, while more is removed outside of the holes 126 and from the area of the holes 126 near the tops thereof.

The sputter deposition/etching may be repeated some number of times sufficient to result in the level of the fill material in the holes 126 to increase to the extent that any voids are effectively moved upwards towards the top of the holes 126, resulting in the structure illustrated in FIGS. 15a and 15b.

With continued reference to FIGS. 15a, 15b, as the voids 132 are no longer inside the holes 126, the holes 126 are now completely filled with fill material (i.e., the holes are no longer holes per se), substantially void-free. Accordingly, a planarization operation may be performed for planarizing the surface of the device, which may result in the device illustrated in FIGS. 12a and 12b. The planarization operation may be any suitable operation for planarizing the top surface of the device. For example, a chemical-mechanical-planarization may be suitable.

Figure 17A:
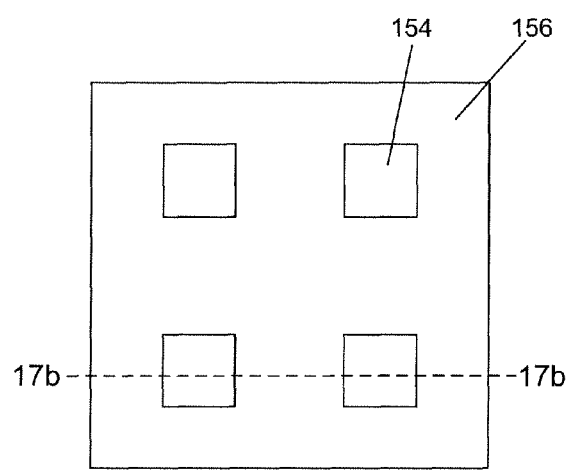
FIGS. 17 and 18 are (a) top and (b) cross sectional schematic views of a substrate after various operations, in accordance with various embodiments of the present invention.
Figure 17B:
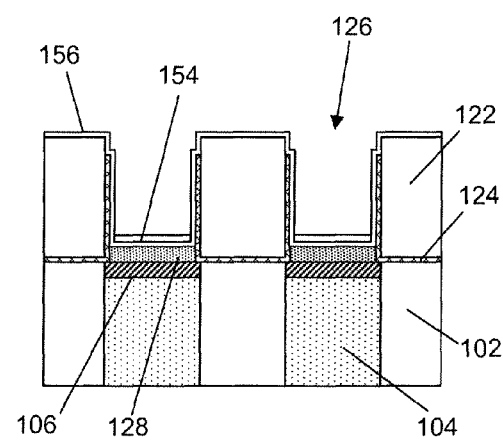

In still further embodiments for filling holes substantially void-free, fill material may be formed in holes by plating the holes with the fill material. As illustrated in FIGS. 17a and 17b, a layer 154 of fill material may be plated onto the bottom surfaces of the holes 126. The plating may be any plating technique suitable for the purpose including, for example, electro-chemical-plating. To facilitate the plating, a seed layer 156 may be formed over the surfaces of the dielectric layer 122 and inside the holes 126, as illustrated. To further facilitate plating onto the bottom surfaces of the holes 126, the plating chemistry may include the appropriate accelerator.

Figure 18A:
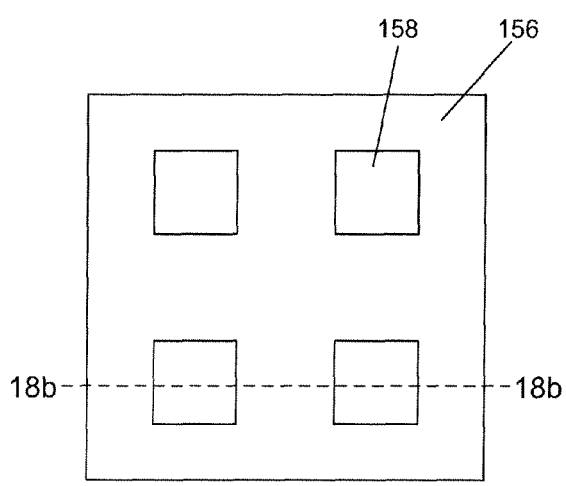
Figure 18B:
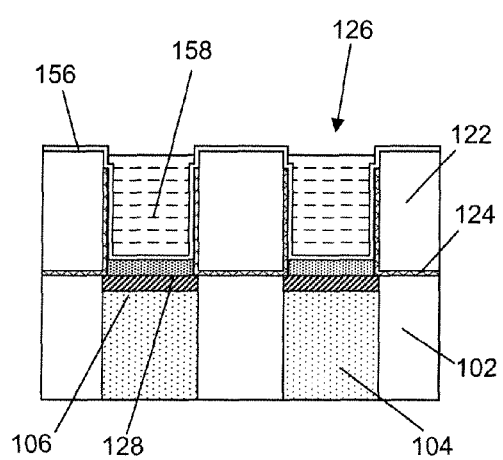

As illustrated in FIGS. 18a and 18b, additional layers 158 may be plated into the holes 126, the plurality of layers being configured in a stack as illustrated.

As discussed herein, owing at least in part to the two-step line patterning, an ultra-high-density pattern of square-shaped holes may be formed. Moreover, the void-removal methods described herein may result in increased reliability of the formed device. Among other types of devices suitable for incorporating the structures formed herein, ultra-high-density phase change memory cells may be formed.

Although certain embodiments have been illustrated and described herein for purposes of description of a preferred embodiment, it will be appreciated by those of ordinary skill in the art that a wide variety of alternate and/or equivalent embodiments or implementations calculated to achieve the same purposes may be substituted for the embodiments illustrated and described without departing from the scope of the present invention. Those with skill in the art will readily appreciate that embodiments in accordance with the present invention may be implemented in a very wide variety of ways. This application is intended to cover any adaptations or variations of the embodiments discussed herein. Therefore, it is manifestly intended that embodiments in accordance with the present invention be limited only by the claims and the equivalents thereof.

What is claimed is:

1. A method comprising:
   forming a sacrificial layer on a substrate;
   forming a mask layer on the sacrificial layer;
   patterning the mask layer to form a plurality of mask lines and to reveal first portions of the sacrificial layer;
   patterning the plurality of mask lines to (i) form a plurality of mask islands by removing portions of the plurality of mask lines and (ii) reveal second portions of the sacrificial layer, the second portions being revealed by removing the portions of the plurality of mask lines;
   removing the revealed first and second portions of the sacrificial layer to form a plurality of pillars of the sacrificial layer, wherein ones of the plurality of pillars are disposed between corresponding ones of the plurality of mask islands and the substrate;
   forming a dielectric layer on the sacrificial layer around the plurality of pillars;
   removing the plurality of mask islands and the plurality of pillars to form a corresponding plurality of holes in the dielectric layer;
   forming an electrode to fill a portion of at least one hole of the plurality of holes in the dielectric layer; and
   depositing a phase change material to substantially fill a remaining portion of the at least one hole that is not filled by the electrode.

2. The method of claim 1, further comprising forming a liner layer over the plurality of pillars after the removing of the revealed first and second portions, wherein the dielectric layer is formed on the liner layer around the plurality of pillars.

3. The method of claim 1, wherein the patterning the mask layer comprises exposing the mask layer with a first photomask including a first plurality of lines, and wherein the patterning the plurality of mask lines comprises exposing the plurality of mask lines with a second photomask including a second plurality of lines.

4. The method of claim 1, wherein the second photomask comprises the first photomask rotated 90°.

5. The method of claim 1, wherein the dielectric layer is formed on the sacrificial layer to gap-fill an area between the plurality of pillars.

* * * * *